United States Patent
Kashi

(10) Patent No.: US 8,526,637 B2
(45) Date of Patent: Sep. 3, 2013

(54) VOLUME CONTROL APPARATUS AND PROGRAM OF VOLUME CONTROL APPARATUS

(75) Inventor: Shuntaro Kashi, Neyagawa (JP)

(73) Assignee: Onkyo Corporation, Neyagawa-shi (JP)

( * ) Notice: Subject to any disclaimer, the term of this patent is extended or adjusted under 35 U.S.C. 154(b) by 387 days.

(21) Appl. No.: 12/883,316

(22) Filed: Sep. 16, 2010

(65) Prior Publication Data

US 2011/0142259 A1    Jun. 16, 2011

(30) Foreign Application Priority Data

Dec. 11, 2009 (JP) ................................. 2009-281064
Feb. 10, 2010 (JP) ................................. 2010-027610

(51) Int. Cl.
*H03G 3/00* (2006.01)
*H03G 7/00* (2006.01)

(52) U.S. Cl.
USPC ........... 381/104; 381/105; 381/106; 381/107; 381/108; 381/109

(58) Field of Classification Search
USPC ....... 381/79, 104, 105, 107, 109, 58; 725/80; 713/1; 709/203
See application file for complete search history.

(56) References Cited

U.S. PATENT DOCUMENTS

| | | | |
|---|---|---|---|
| 5,239,458 A | 8/1993 | Suzuki | |
| 2005/0010964 A1 | 1/2005 | Sano et al. | |
| 2009/0208035 A1 | 8/2009 | Sunaga et al. | |
| 2009/0323987 A1 * | 12/2009 | Yang et al. | 381/109 |

FOREIGN PATENT DOCUMENTS

| | | |
|---|---|---|
| EP | 1 061 657 A2 | 12/2000 |
| JP | 7-34531 | 4/1995 |
| JP | 11-330998 | 11/1999 |
| JP | 2000-356991 | 12/2000 |
| JP | 2001-196959 | 7/2001 |
| JP | 2002-084589 | 3/2002 |
| JP | 2002-223492 | 8/2002 |
| JP | 2005-031494 | 2/2005 |
| JP | 2005-142962 | 6/2005 |
| JP | 2005-210163 | 8/2005 |
| JP | 2005-328229 | 11/2005 |
| JP | 2009-194815 | 8/2009 |

* cited by examiner

*Primary Examiner* — Vivian Chin
*Assistant Examiner* — Ammar Hamid
(74) *Attorney, Agent, or Firm* — Renner, Otto, Boisselle & Sklar, LLP

(57) ABSTRACT

A volume control apparatus that is connectable to a controller and controls a volume value of a sound signal based on an instruction from the controller includes a receiving section for, when a controller-side volume setting value settable in the controller is changed by a user's operation, receiving the changed controller-side volume setting value from the controller. The apparatus also includes a first difference value calculating section for calculating a first difference value between the changed controller-side volume setting value and the controller-side volume setting value before change, a second difference value calculating section for calculating a second difference value between a maximum volume value controllable by the controller and a current volume value, and an increase value calculating section for multiplying the second difference value by a ratio of the first difference value so as to calculate an increase value of the volume value.

6 Claims, 13 Drawing Sheets

VOLUME CONTROL APPARATUS AND PROGRAM OF VOLUME CONTROL APPARATUS

BACKGROUND OF THE INVENTION

1. Field of the Invention

The present invention relates to a volume control apparatus in which a volume value is controlled by a controller.

2. Description of the Related Art

AV amplifier is connected to PC via network such as LAN, and contents reproduction is controlled by control program (hereinafter, controllers) installed into the PC. Server program (hereinafter, servers) is also installed into the PC, and a plurality of audio files are recorded in HDD of the PC. When audio file recorded in the HDD is selected by users' operation, the controller transmits instruction for reproducing the selected audio files to the AV amplifier. The AV amplifier requests the server to transmit the selected audio files. The server reads the selected audio files from the HDD and transmits them to the AV amplifier. The AV amplifier decodes the audio files transmitted from the server, and amplifies them so as to output sounds through speaker.

When instruction for changing controller-side volume setting value is input by users' mouse operation, controller transmits the changed controller-side volume setting value to AV amplifier. Accordingly, the AV amplifier controls the volume value at the time when the AV amplifier amplifies sound signals. Slide bar for changing the controller-side volume setting value by means of users' operation is provided to operation screens of the controller. When the slide bar is moved, the controller-side volume setting value is changed so that the volume value of the AV amplifier is controlled. Therefore, it is demanded that the volume values of the AV amplifier is suitably (namely, clearly for the users) changed according to the changes in the controller-side volume setting value.

When the user increases the controller-side volume setting value to maximum value (or around the maximum values) at a stroke, the volume value of the AV amplifier rises straight to the maximum value (or around the maximum values). As a result, amplifying circuit and speaker of the AV amplifier might be damaged.

Further, when a function for posting the volume value of the AV amplifier from the AV amplifier to the controller and changing the controller-side volume setting value according to the volume value of the AV amplifier are not provided, the following problem arises. When the controller is connected to the AV amplifier via LAN, the volume of the AV amplifier already has fairly large value (or the volume value of the AV amplifier is increased by operating volume control knob of not the controller but the AV amplifier), whereas the controller-side volume setting value is intermediate values, for example, (50 in the case of 0 to 100). In this case, when user views display of the controller-side volume setting value, falsely recognizes that the volume value of the AV amplifiers is still small, and thus increases the controller-side volume setting value, the volumes value of the AV amplifier becomes very large, and thus the AV amplifier and the speaker are damaged.

SUMMARY OF THE INVENTION

It is an object of the present invention to provide a volume control apparatus that calculates a suitable change in a volume value according to a change in a controller-side volume setting value when receiving the controller-side volume setting value from a controller.

It is another object of the present invention to provide a volume control apparatus that calculates a change amount of a volume value for preventing damages of an amplifier and a speaker according to a change amount of a controller-side volume setting value when receiving the controller-side volume setting value from a controller.

In the preferred embodiment, a volume control apparatus that is connectable to a controller and controls a volume value of a sound signal based on an instruction from the controller, comprises: a receiving section for, when a controller-side volume setting value settable in the controller is changed by a user's operation, receiving the changed controller-side volume setting value from the controller; a first difference value calculating section for calculating a first difference value as a difference value between the changed controller-side volume setting value and the controller-side volume setting value before change; a second difference value calculating section for calculating a second difference value as a difference value between a maximum volume value controllable by the controller and a current volume value; and an increase value calculating section for multiplying the second difference value by a ratio of the first difference value to (a maximum value of the controller-side volume setting value–a minimum value of the controller-side volume setting value)) (or to (the maximum value of the controller-side volume setting value–the controller-side volume setting value before change)) so as to calculate an increase value of the volume value.

A suitable increase value of the volume value can be calculated according to the change in the controller-side volume setting value. Further, when a maximum volume value controllable by the controller is set to a volume value for preventing the damages of the amplifier and the speaker, the increase value of the volume value for preventing the damages of the amplifier and the speaker can be calculated according to the change in the controller-side volume setting value.

In the preferred embodiment, when the controller-side volume setting value is changed into the maximum value, the volume value is increased to the maximum volume value controllable by the controller.

In the preferred embodiment, the maximum volume value controllable by the controller can be changed by a user's operation, after the maximum volume value controllable by the controller is changed according to the user's operation, when the controller-side volume setting value is changed, the volume value is not changed until the volume value calculated based on the changed maximum volume value controllable by the controller is equal to or less than the maximum volume value controllable by the controller before change.

In the preferred embodiment, a volume control apparatus that is connectable to a controller and controls a volume value of a sound signal based on an instruction from the controller, comprises: a receiving section for, when a controller-side volume setting value settable in the controller is changed by a user's operation, receiving the changed controller-side volume setting value from the controller; a first difference value calculating section for calculating a first difference value as a difference value between the changed controller-side volume setting value and the controller-side volume setting value before change; a third difference value calculating section for calculating a third difference value as a difference value between a current volume value and a minimum volume value controllable by the controller; and a decrease value calculating section for multiplying the third difference value by a ratio of the first difference value to (the controller-side volume setting value before change–a minimum value of the controller-side volume setting value) (or to (a maximum value of the controller-side volume setting value–the minimum value of the controller-side volume setting value)) so as to calculate a decrease value of the volume value.

A suitable decrease value of the volume value can be calculated according to the change in the controller-side volume setting value. For example, when the controller-side volume setting value is changed into a minimum volume value, the volume value can be changed to a minimum volume value controllable by the controller.

In the preferred embodiment, a volume control apparatus that is connectable to a controller and controls a volume value of a sound signal based on an instruction from the controller, comprises: a receiving section for, when a controller-side volume setting value settable in the controller is changed by a user's operation, receiving a first difference value between the changed controller-side volume setting value and the controller-side volume setting value before change from the controller; a second difference value calculating section for calculating a second difference value as a difference value between a maximum volume value controllable by the controller and a current volume value; and an increase value calculating section for multiplying the second difference value by a ratio of the first difference value to (a maximum value of the controller-side volume setting value–a minimum value of the controller-side volume setting value)) (or to (the maximum value of the controller-side volume setting value–the controller-side volume setting value before change)) so as to calculate an increase value of the volume value.

In the preferred embodiment, a volume control apparatus that is connectable to a controller and controls a volume value of a sound signal based on an instruction from the controller, comprises: a receiving section for, when a controller-side volume setting value settable in the controller is changed by a user's operation, receiving a first difference value as a difference value between the changed controller-side volume setting value and the controller-side volume setting value before change from the controller; a third difference value calculating section for calculating a third difference value as a difference value between a current volume value and a minimum volume value controllable by the controller; and a decrease value calculating section for multiplying the third difference value by a ratio of the first difference value to (the controller-side volume setting value before change–a minimum value of the controller-side volume setting value) (or to (a maximum value of the controller-side volume setting value–the minimum value of the controller-side volume setting value)) so as to calculate a decrease value of the volume value.

DETAILED DESCRIPTION OF THE PREFERRED EMBODIMENTS

Figure 1:
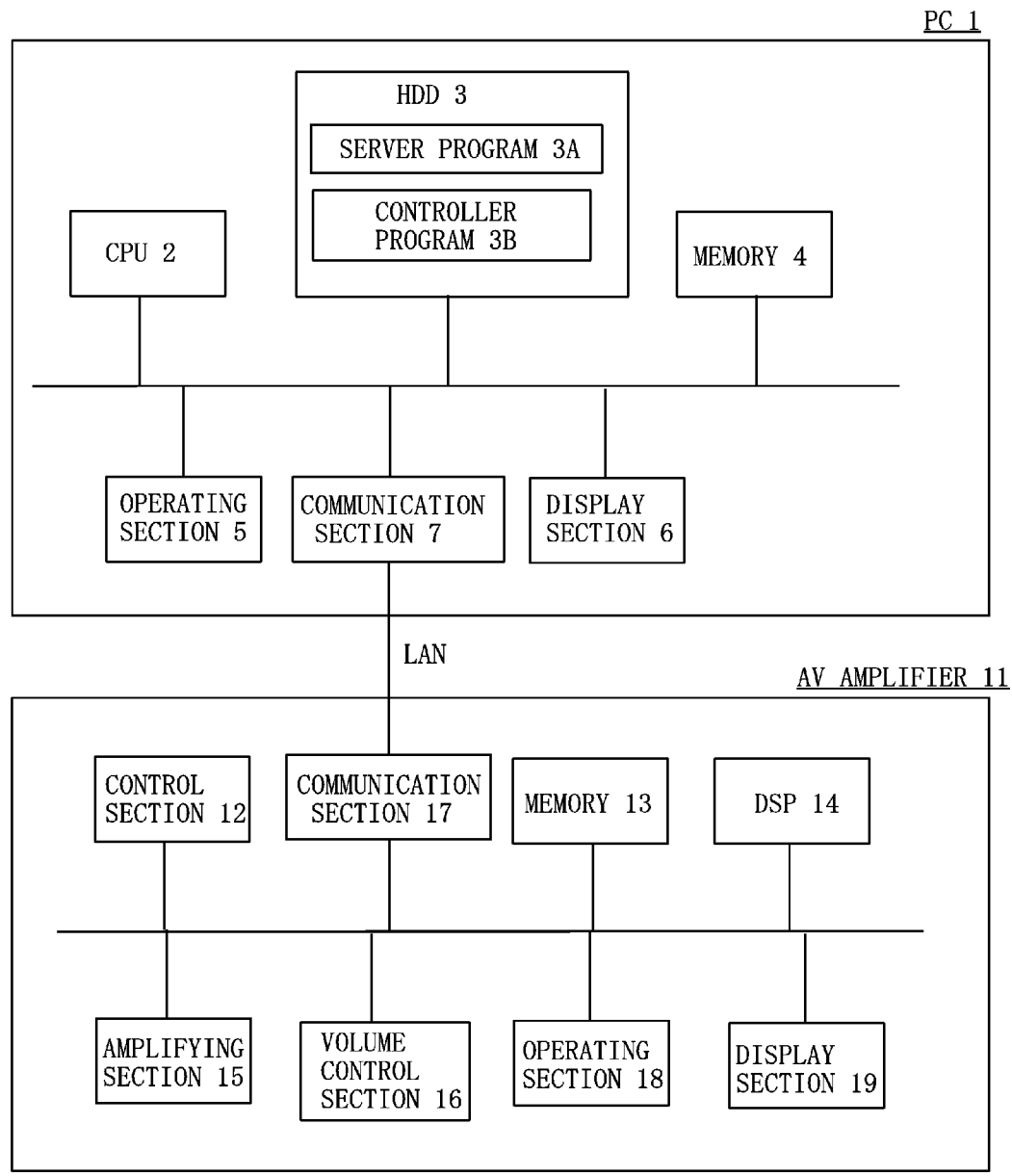
FIG. 1 is a block diagram illustrating PC and an AV amplifier according to a preferred embodiment of the present invention.

Preferred embodiments of the present invention are described concretely below with reference to the drawings, but the present invention is not limited to these embodiments. As shown in FIG. 1, an audio system of the present invention has a PC 1 and an AV amplifier (referred to also as an AV receiver) (volume control apparatus) 11, and they can be connected to each other via a network such as LAN. Further, they may be connected via another electric communication line such as HDMI, IEEE1394 or USB.

The PC 1 has a CPU 2, an HDD 3, a memory (ROM, RAM etc.) 4, an operating section 5, a display section 6, and a communication section 7. The CPU 2 controls the respective sections of the PC 1 based on OS or another program recorded in the HDD 3. A server program (hereinafter, a server) 3A and a controller program (hereinafter, a controller) 3B are installed into the HDD 3. These programs are developed in the memory 4 so as to be executed by the CPU 2. A plurality of contents data is recorded in the HDD 3. The contents data are audio data, and in this example, they are audio files. When the server 3A receives a request for transmitting an audio file from the AV amplifier 11, the server 3A reads the audio file from the HDD so as to transmit it to the AV amplifier 11 via LAN.

The controller 3B controls reproduction of contents in the AV amplifier 11. When an audio file to be reproduced is selected from the audio files recorded in the HDD 3 by a user's operation, the controller 3B transmits an instruction for reproducing the selected audio file to the AV amplifier 11 via LAN.

Figure 2:
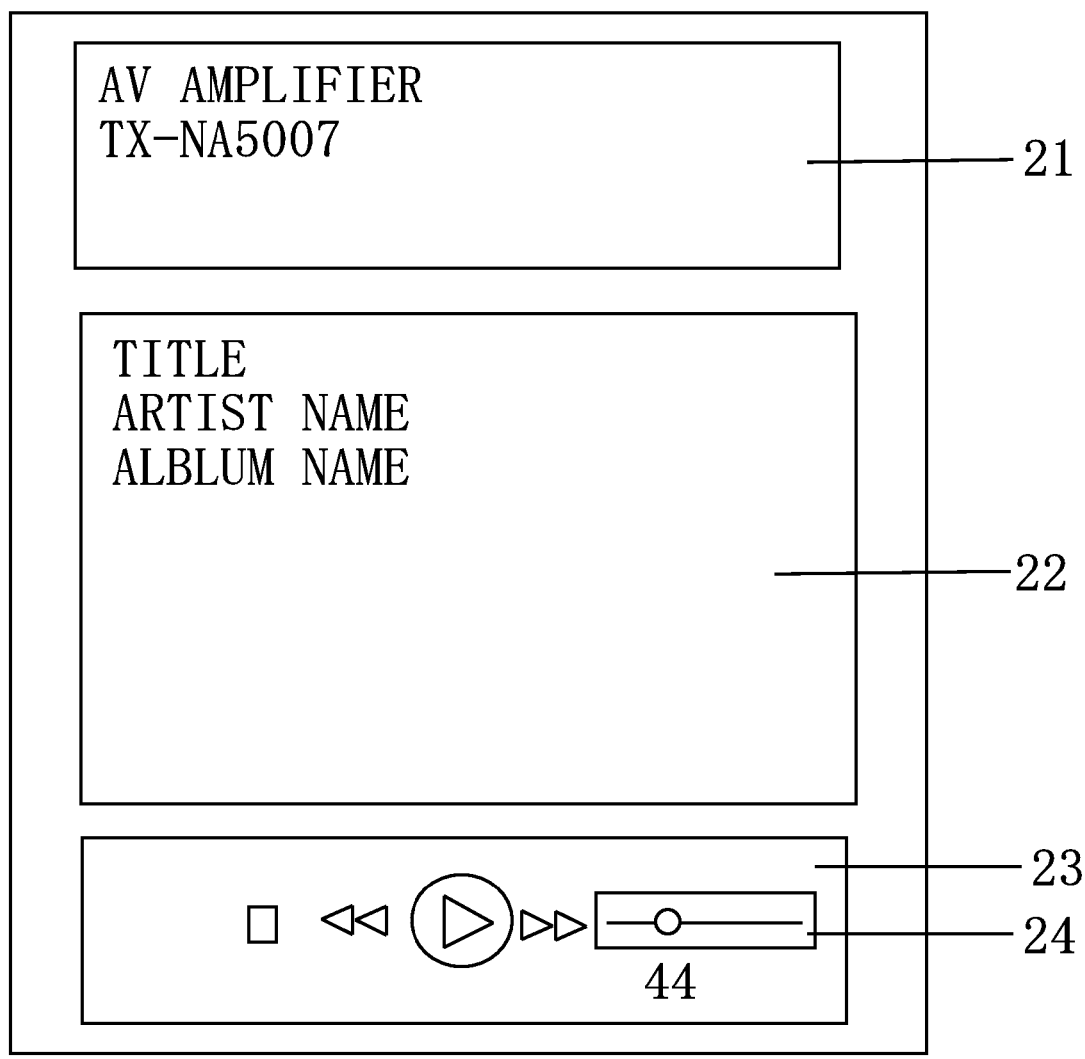
FIG. 2 is a diagram illustrating an operation screen of a controller.

The controller 3B stores a controller-side volume setting value in the memory 4. The controller-side volume setting value is a value for controlling a volume value of the AV amplifier 11 on a controller side. When an instruction for changing the controller-side volume setting value is input by a user's operation, the controller 3B transmits the changed controller-side volume setting value to the AV amplifier 11 so as to allow the AV amplifier 11 to change the volume value. FIG. 2 is a diagram illustrating an operation screen of the controller 3B. The operation screen includes an area 21 showing the AV amplifier 11 to be controlled, an area 22 showing an audio file to be reproduced by the AV amplifier 11, and an area 23 showing various operating buttons. The area 23 includes a slide bar 24 showing a controller-side volume setting value. The controller-side volume setting value can be changed within a range from a minimum value to a maximum value (not particularly limited, but for example, 0 to 100) by moving the slide bar.

User's operations are input into the operating section 5, and the operating section 5 is, for example, a mouse, a keyboard, and a remote controller. The display section 6 displays the operation screen of the controller 3B, and is, for example, LCD. The communication section 7 communicates with the AV amplifier 11 via LAN, and is, for example, a LAN interface.

The AV amplifier 11 includes a control section 12, a memory (ROM, RAM. etc.) 13, a DSP 14, an amplifying section 15, a volume control section 16, a communication section 17, an operating section 18, and a display section 19. The control section 12 executes respective processes, described later, based on operating programs of the AV amplifier stored in the memory 13, and is, for example, a microcomputer. When the control section 12 receives the instruction for reproducing an audio file from the controller 3B, the control section 12 requests the server 3A to transmit the audio file.

The communication section 17 communicates with the PC 1 via LAN, and is, for example, a LAN interface. When the communication section 17 receives the audio file from the server 3B, the DSP 14 decodes and D/A-converts the audio file, so as to generate an analog audio signal. The volume control section 16 controls a volume value of the audio signal, and the amplifying section 15 amplifies the audio signal so as to output a sound from a speaker connected to the outside. User's operations are input into the operating section 18, and the operating section 18 is, for example, an operating button or a remote controller. The operating section 18 includes a volume control knob for changing a volume value of the volume control section 16. The display section 19 displays the volume value of the volume control section 16, and is, for example, an FL tube.

A maximum volume value F(DMRVolMax) and a minimum volume value F(DMRVolMin) of the volume control section 16 controllable by a controller 3B are recorded in the memory 13 in advance. F(DMRVolMax) is set to a value that is smaller than a maximum volume value of the volume control section 16 controllable by the operating section 18 (volume control knob), namely, a value that does not damage the amplifying section 15 and the speaker. F(DMRVolMin) is set to a value larger than a minimum volume value of the volume control section 16 controllable by the operating section 18 (volume control knob). F(DMRVolMax) and F(DMRVolMin) may be suitably changed by a user's operation. Further, F(DMRVolMax) may be set to the same value as the maximum volume value of the volume control section 16 controllable by the operating section 18 (volume control knob). F(DMRVolMin) may be set to the same value as the minimum volume value of the volume control section 16 controllable by the operating section 18 (volume control knob).

Figure 3:
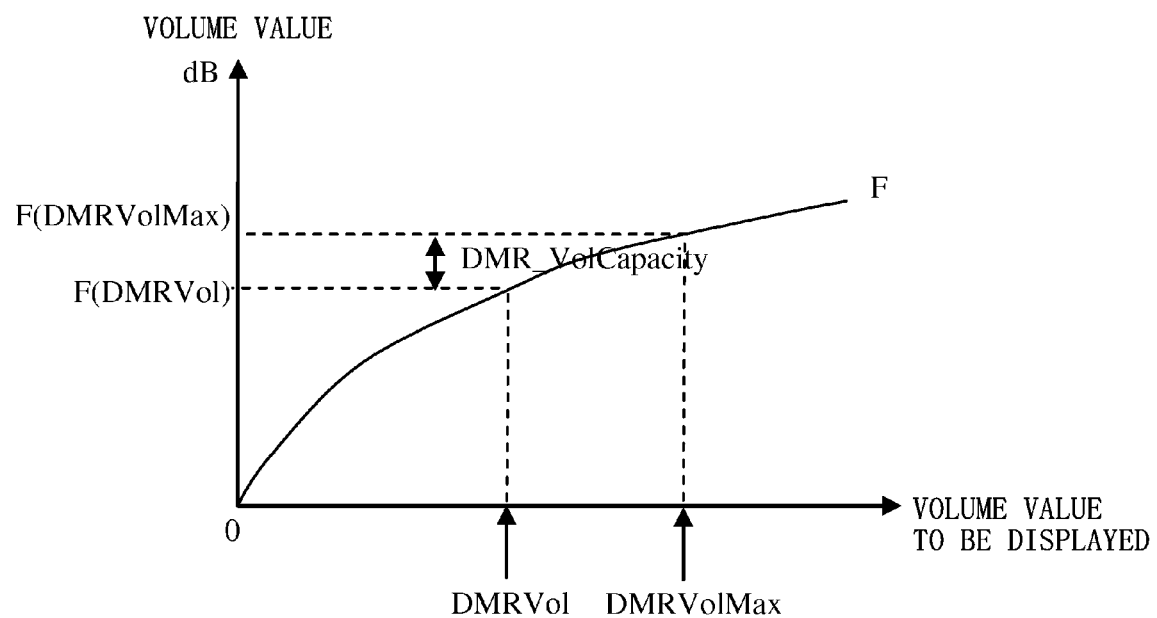
FIG. 3 is a diagram describing a maximum volume value controllable by the controller.
Figure 4:
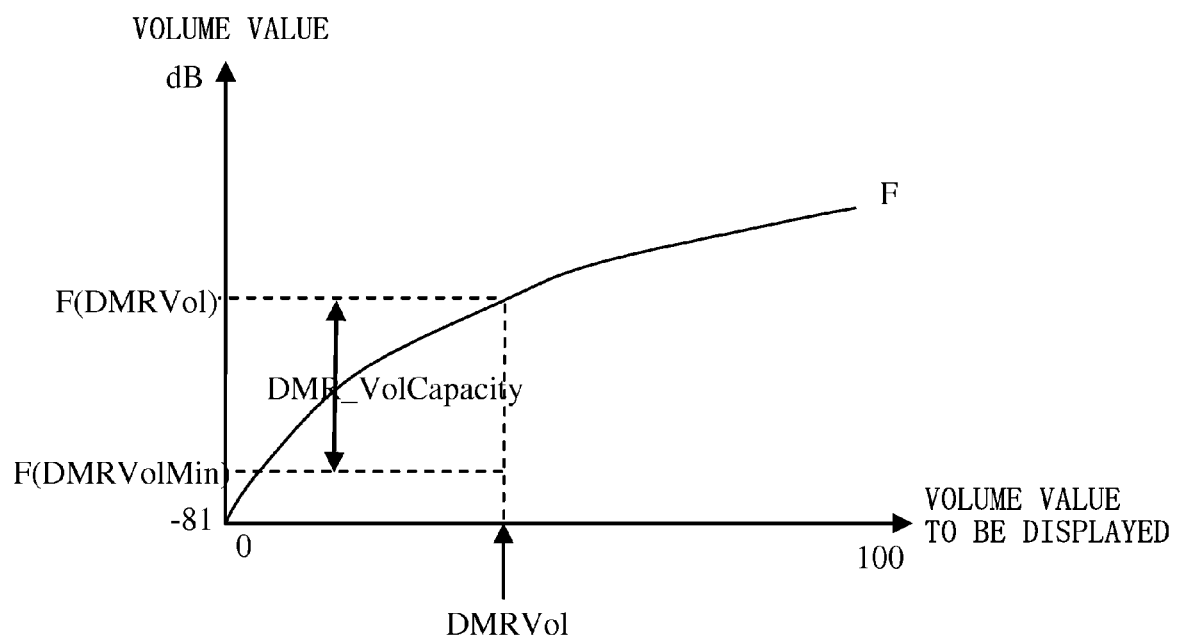
FIG. 4 is a diagram describing a minimum volume value controllable by the controller.

FIG. 3 is a graph illustrating the maximum volume value F(DMRVolMax), an abscissa axis represents a volume value to be displayed on the display section 19, and an ordinate axis represents an actual volume value (unit: dB) of the volume control section 16. FIG. 4 is a graph illustrating the minimum volume value F(DMRVolMin), an abscissa axis represents a volume value to be displayed on the display section 19, and an ordinate axis represents an actual volume value (unit: dB) of the volume control section 16.

A controller-side volume setting value before change is stored in the memory 13. This is because when a changed controller-side volume setting value is received from the controller, a first difference value as a difference value between the changed controller-side volume setting value and the controller-side volume setting value before change is calculated. When the controller 3B transmits the controller-side volume setting value before change together with the changed controller-side volume setting value, the controller-side volume setting value before change does not have to be stored.

When the volume value is increased, the control section 12 calculates the first difference value as the difference value between the changed controller-side volume setting value and the controller-side volume setting value before change. The control section 12 calculates a second difference value as a difference value between the maximum volume value controllable by the controller and a current volume value. The control section 12 multiplies the second difference value by a ratio of the first difference value to (the maximum value of the controller-side volume setting value–the minimum value of the controller-side volume setting value), so as to calculate an increase value of the volume value.

The maximum value of the controller-side volume setting value and the minimum value of the controller-side volume setting value are stored in the memory 13 in advance. In another manner, when the controller 3B is first connected to the AV amplifier 11, these values may be posted from the controller 3B so as to be stored in the memory 13.

When the volume value is decreased, the control section 12 calculates the first difference value as the difference value between the changed controller-side volume setting value and the controller-side volume setting value before change. The control section 12 calculates a third difference value as a difference value between the current volume value and the minimum volume value controllable by the controller. Further, the control section 2 multiplies the second difference value by a ratio of the third difference value to (the controller-side volume setting value before change–the minimum value of the controller-side volume setting value), so as to calculate the decrease value of the volume value.

Figure 5:
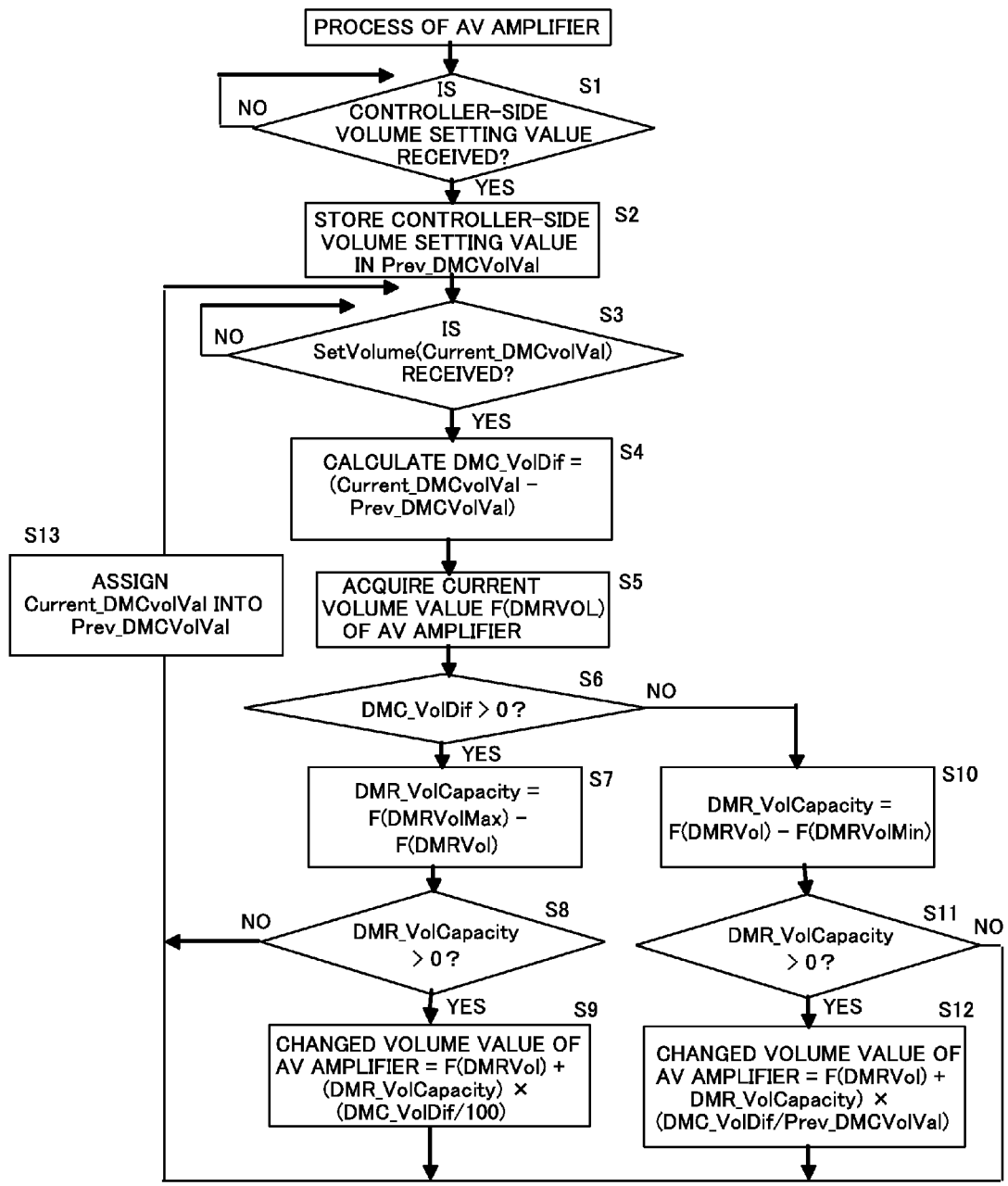
FIG. 5 is a flowchart illustrating a process of a control section of the AV amplifier.
Figure 6:
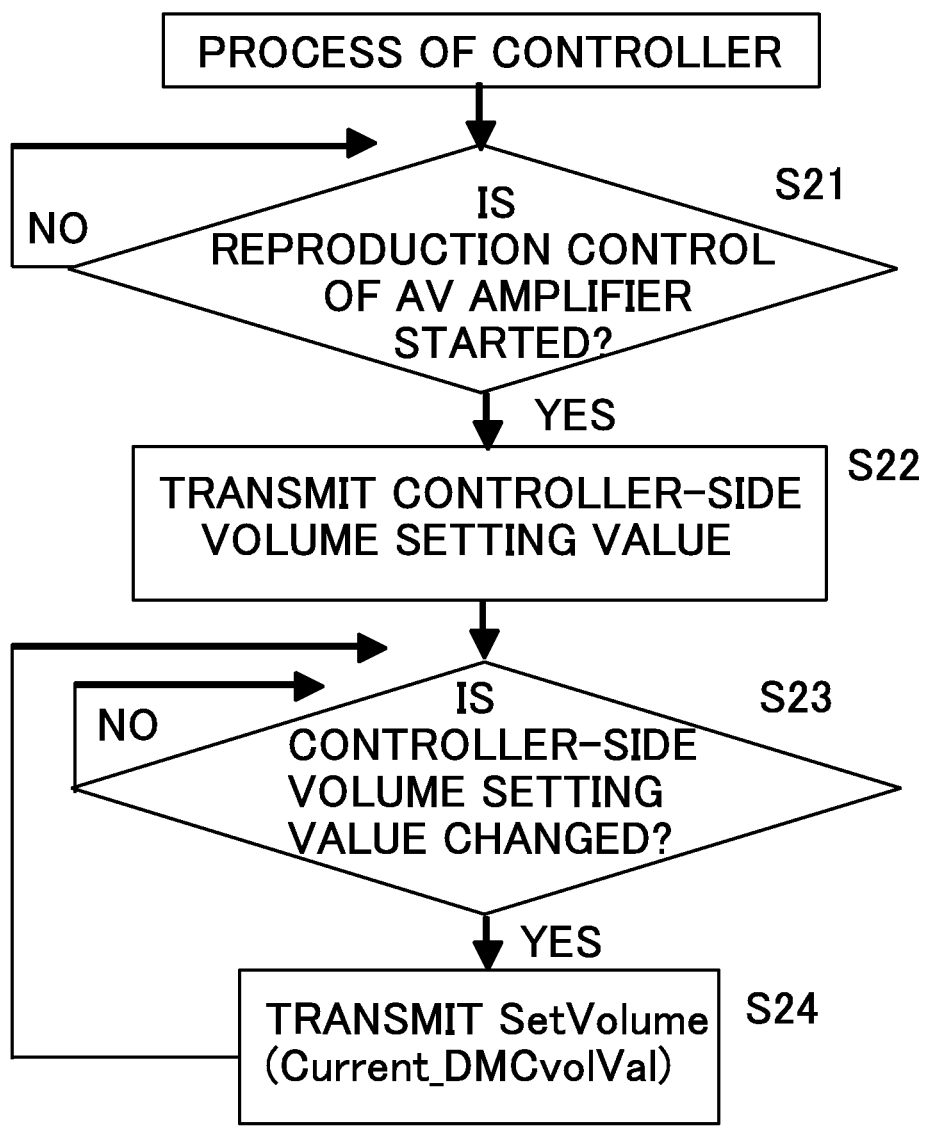
FIG. 6 is a flowchart illustrating a process of the controller.

An operation of this example is described below. FIG. 5 is a flowchart illustrating a process of the control section 12 of the AV amplifier 11, and FIG. 6 is a flowchart illustrating a process of the controller 3B. As shown in FIG. 6, the controller 3B determines whether or not reproduction control of the AV amplifier 11 is started (S21). For example, when the AV amplifier 11 is selected from devices connected to LAN by a user's operation and an audio file to be reproduced is selected from the audio files recorded in the HDD 3, the determination is made that the reproduction control of the AV amplifier 11 is started (YES in S21). At this time, the controller 3B transmits an initial value of the controller-side volume setting value (a current value of the slide bar) to the AV amplifier 11 (S22).

As shown in FIG. 5, the control section 12 of the AV amplifier 11 determines whether or not the initial value of the controller-side volume setting value is received from the controller 3B (S1). When it is received, the control section 12 stores the received initial value of the controller-side volume setting value in a variable Prev_DMCVolVal in the memory 13 (S2). Prev_DMCVolVal represents the controller-side volume setting value before change.

As shown in FIG. 6, the controller 3B determines whether or not a position of the slide bar is changed by a user's operation and the controller-side volume setting value is changed (S23). When it is changed (YES in S23), the controller 3B transmits an instruction SetVolume(Current_DMCvolVal) for changing the volume value to the AV amplifier 11 (S24). Current_DMCvolVal is the changed controller-side volume setting value. That is to say, the controller 3B transmits the changed controller-side volume setting value to the AV amplifier 11.

As shown in FIG. 5, the control section 12 of the AV amplifier 11 determines whether or not SetVolume(Current_DMCvolVal) is received from the controller 3B (S3). When it is received (YES in S3), the control section 12 calculates DMC_VolDif=(Current_DMCvolVal−Prev_DMCVolVal) so as to store it in the memory 13 (S4). DMC_VolDif is the difference value (first difference value) between the changed controller-side volume setting value and the controller-side volume setting value before change, and is a value representing a change amount of the controller-side volume setting value. At first, since the initial value of the controller-side volume setting value is stored in Prev_DMCVolVal, it is a difference value between the changed controller-side volume setting value and the initial value of the controller-side volume setting value.

The control section 12 acquires a current volume value F(DMRVol) of the volume control section 16 of the AV amplifier 11 from the memory 13 (S5). The control section 12 determines whether or not DMC_VolDif is a positive value (S6).

When DMC_VolDif is a positive value (YES in S6), namely, the changed controller-side volume setting value is increased more than the controller-side volume setting value before change, the control section 12 calculates DMR_VolCapacity=F(DMRVolMax)−F(DMRVol), and stores the calculated value in the memory 13 (S7). That is to say, DMR_VolCapacity is the difference value between the maximum volume value controllable by the controller 3B and the current volume value (second difference value) as shown in FIG. 3, and a value that can increase the volume value by means of the controller 3B at this time.

The control section 12 determines whether or not DMR_VolCapacity>0, namely, the volume value can be increased according to SetVolume(Current_DMCvolVal) transmitted from the controller 3B (S8). When DMR_VolCapacity>0 (Yes in S8), the control section 12 calculates the changed volume value of the volume control section 16=F(DMRVol)+(DMR_VolCapacity)×(DMC_VolDif/100), and changes the volume value of the volume control section 16 to the calculated volume value. (DMR_VolCapacity)×(DMC_VolDif/100) is the increase value of the volume value. That is to say, the increase value of the volume value becomes a value obtained by multiplying DMR_VolCapacity by a ratio of DMC_VolDif to (the maximum value of the controller-side volume setting value−the minimum value of the controller-side volume setting value, here, 100−0=100).

Thereafter, the control section 12 stores Current_DMCvolVal in Prev_DMCVolVal, so as to store the latest controller-side volume setting value (S13), and returns to S3. Therefore, when SetVolume(Current_DMCvolVal) is received next time, DMC_VolDif is calculated based on Prev_DMCVolVal stored in S13 and Current_DMCvolVal newly received (S4).

On the other hand, when DMR_VolCapacity>0 does not hold (NO in S8), the volume value is not further increased. The control section 12 stores Current_DMCvolVal in Prev_DMCVolVal so as to store the latest controller-side volume setting value (S13), and returns to S3. Therefore, since the volume value does not become larger than F(DMRVolMax) due to the control of the controller 3B, the amplifying section 15 and the speaker are prevented from being damaged.

When DMC_VolDif has a negative value in S6 (NO in S6), namely, the changed controller-side volume setting value is reduced more than the controller-side volume setting value before change, the control section 12 calculates DMR_VolCapacity=F(DMRVol)−F(DMRVolMin), and stores the calculated value in the memory 13 (S10). That is to say, DMR_VolCapacity is the difference value between the minimum volume value controllable by the controller 3B and the current volume value (third difference value) as shown in FIG. 4, and is a value that can reduce the volume value using the controller 3B at this time.

The control section 12 determines whether or not DMR_VolCapacity>0, namely, the volume value can be reduced according to SetVolume(Current_DMCvolVal) from the controller 3B (S11). When DMR_VolCapacity>0 (Yes in S11), the control section 12 calculates the changed volume value of the volume control section 16=F(DMRVol)+DMR_VolCapacity×(DMC_VolDif/Prev_DMCVolVal), and changes the volume value of the volume control section 16 into the calculated volume value (S12). DMR_VolCapacity×(DMC_VolDif/Prev_DMCVolVal) is the decrease value of the volume value. That is to say, the decrease value of the volume value becomes a value obtained by multiplying DMR_VolCapacity by a ratio of DMC_VolDif to (the controller-side volume setting value before change−the minimum value of the controller-side volume setting value, here, the controller-side volume setting value before change−0=the controller-side volume setting value before change). Since DMC_VolDif has a negative value, DMR_VolCapacity×(DMC_VolDif/Prev_DMCVolVal) becomes a negative value.

Thereafter, the control section 12 stores Current_DMCvolVal in Prev_DMCVolVal so as to store the latest controller-side volume setting value (S13), and returns to S3. Therefore, when SetVolume(Current_DMCvolVal) is received next time, DMC_VolDif is calculated based on Prev_DMCVolVal stored in S13 and Current_DMCvolVal newly received (S4).

On the other hand, when DMR_VolCapacity>0 does not hold (NO in S11), the volume value is not further decreased. The control section 12 stores Current_DMCvolVal in Prev_DMCVolVal so as to store the latest controller-side volume setting value (S13), and returns to S3. Therefore, the volume value can be prevented from becoming smaller than F(DMRVolMin).

The above process is described by using actual numerical values. When F(DMRVolMax)=−10 dB, F(DMRVol)=−30 dB, DMR_VolCapacity=20 dB, Prev_DMCVolVal=50, Current_DMCvolVal=90 and DMC_VolDif=40, the determination is made as YES in S6 and YES in S8, and the changed volume is −30 dB+20 dB×40/100=−22 dB. That is to say, when the controller-side volume setting value is changed from 50 into 90, the volume value of the volume control section 16 is increased from −30 dB to −22 dB.

When F(DMRVolMin)=−80 dB, F(DMRVol)=−30 dB, DMR_VolCapacity=50 dB, Prev_DMCVolVal=80, Current_DMCvolVal=20 and DMC_VolDif=−60, the determination is made as NO in S6 and YES in S11, and the changed volume is −30 dB+50 dB×(−60)/80=−67.5 dB. That is to say, when the controller-side volume setting value is changed from 80 into 20, the volume value of the volume control section 16 is reduced from −30 dB to −67.5 dB.

When F(DMRVolMin)=−80 dB, F(DMRVol)=−30 dB, DMR_VolCapacity=50 dB, Prev_DMCVolVal=80, Current_DMCvolVal=0 and DMC_VolDif=−80, the determination is made as NO in S6 and YES in S11, and the changed volume is −30 dB+50 dB×(−80)/80=−80. That is to say, when the controller-side volume setting value is changed into 0 as the minimum value, the volume value of the volume control section 16 can be reduced −80 dB that is the minimum volume value controllable by the controller 3B. This is because DMC_VolDif is divided not by (the maximum value of the controller-side volume setting value−the minimum value of the controller-side volume setting value=100) but by (the controller-side volume setting value before change Prev_DMCVolVal−the minimum value of the controller-side volume setting value=Prev_DMCVolVal) in S12.

According to the present invention, the volume value of the AV amplifier 11 can be suitably changed according to the change in the controller-side volume setting value. Further, even when the controller-side volume setting value is made to be very large, the volume value of the AV amplifier 11 does not become larger than F(DMRVolMax), thereby preventing the amplifying section and the speaker from being damaged.

Figure 5B:
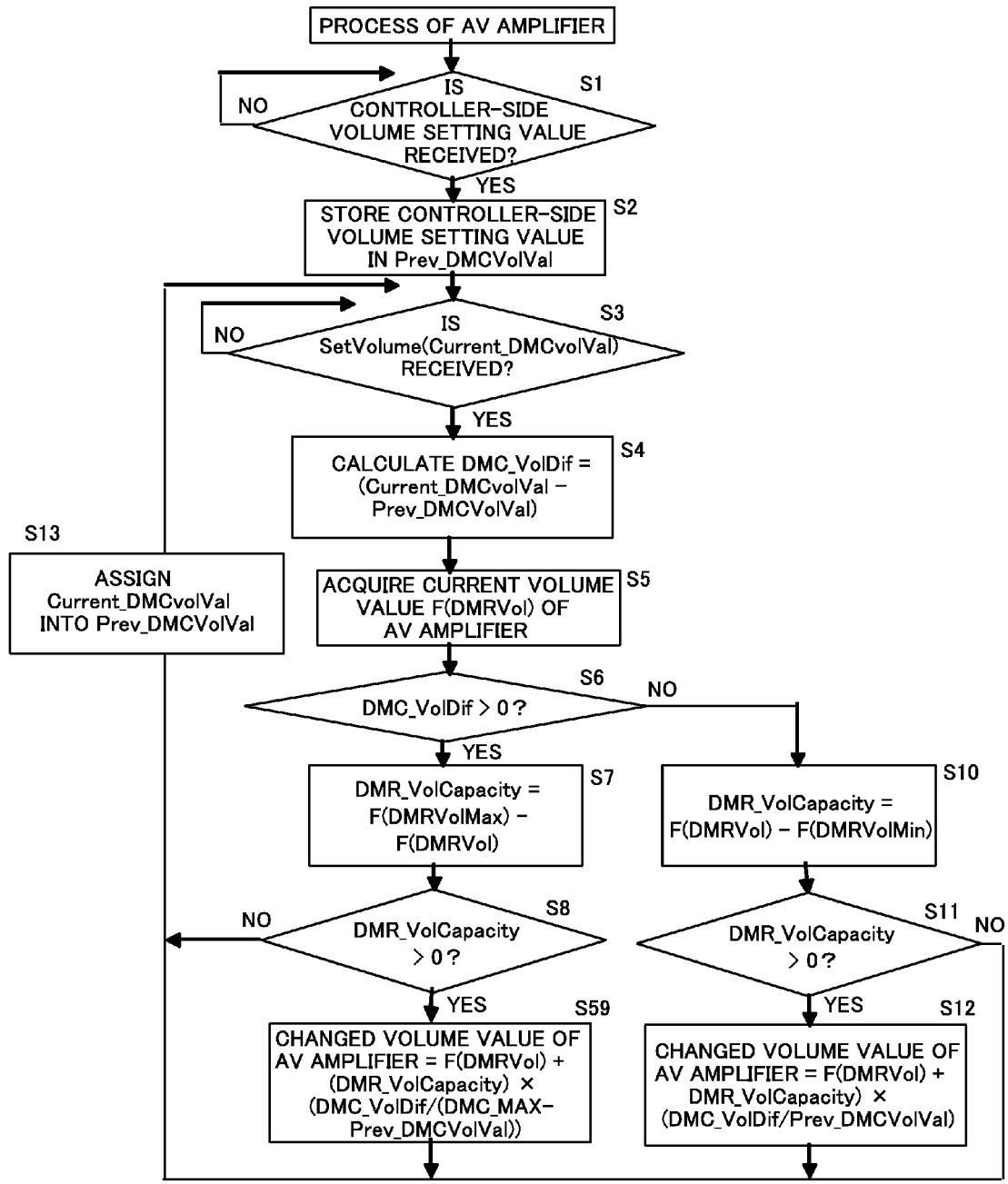
FIG. 5B is a flowchart illustrating a modified example of FIG. 5.

As shown in FIG. 5B, the process in S59 may be executed instead of S9 in FIG. 5. That is to say, the control section 12 calculates the changed volume value of the volume control section 16=F(DMRVol)+(DMR_VolCapacity)×(DMC_VolDif/(DMC_MAX−Prev_DMCVolVal)), and changes the volume value of the volume control section 16 into the calculated volume value. (DMR_VolCapacity)×(DMC_VolDif/(DMC_MAX−Prev_DMCVolVal)) is an increase value of the volume value. That is to say, the increase value of the volume value becomes a value obtained by multiplying DMR_VolCapacity by a ratio of DMC_VolDif to (the maximum value of the controller-side volume setting value−the controller-side volume setting value before change).

Figure 7:
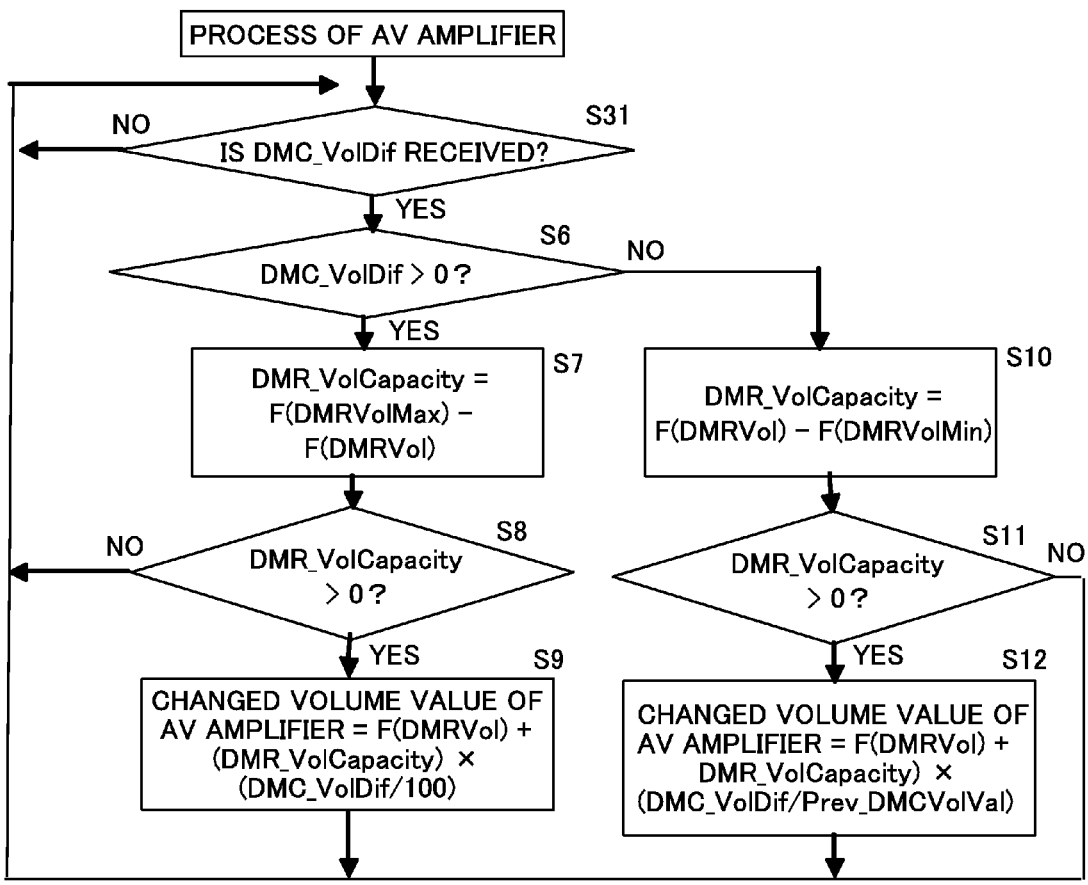
FIG. 7 is a flowchart illustrating a process of the control section of the AV amplifier.
Figure 8:
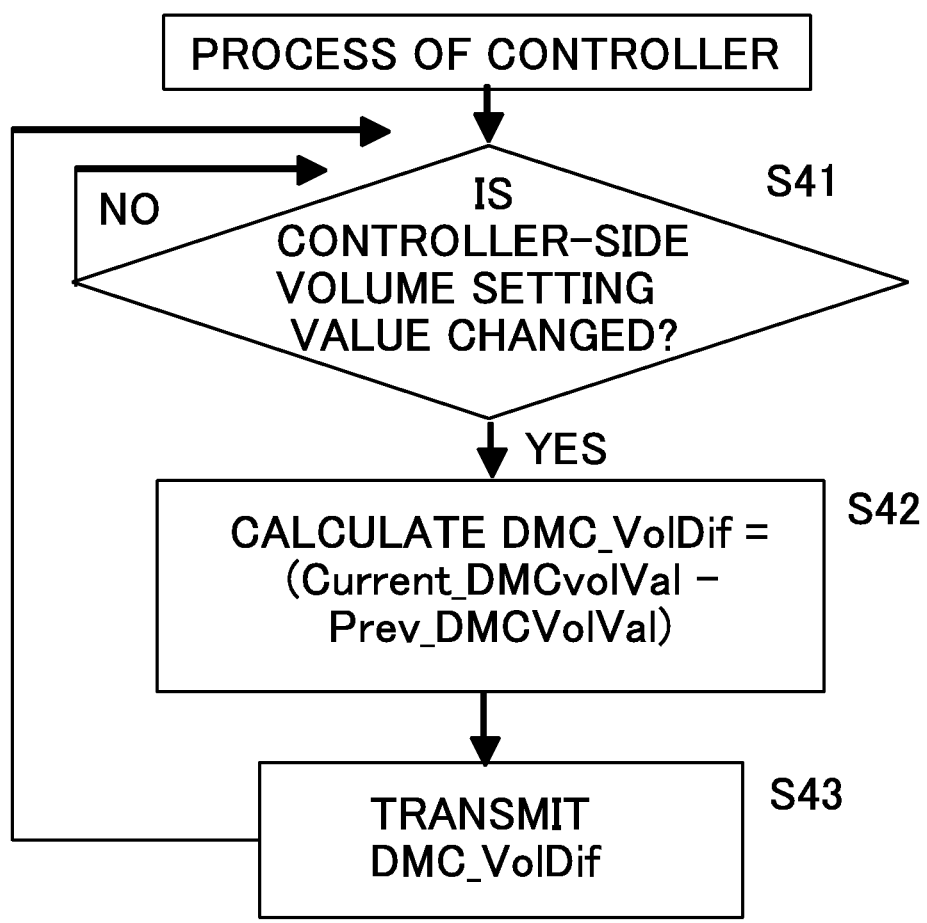
FIG. 8 is a flowchart illustrating a process of the controller.

Another preferred embodiment of the present invention is described below. In this example, when the controller-side volume setting value is changed, the controller 3B calculates the first difference value DMC_VolDif, and transmits it to the AV amplifier 11. As a result, the AV amplifier does not have to calculate the first difference value DMC_VolDif, and also does not have to store the controller-side volume setting value before change. FIG. 7 illustrates a process of the AV amplifier 11 in this example, and FIG. 8 illustrates a process of the controller 3B. The same processes as those in FIGS. 5 and 6 are denoted by the same reference numerals.

Figure 7B:
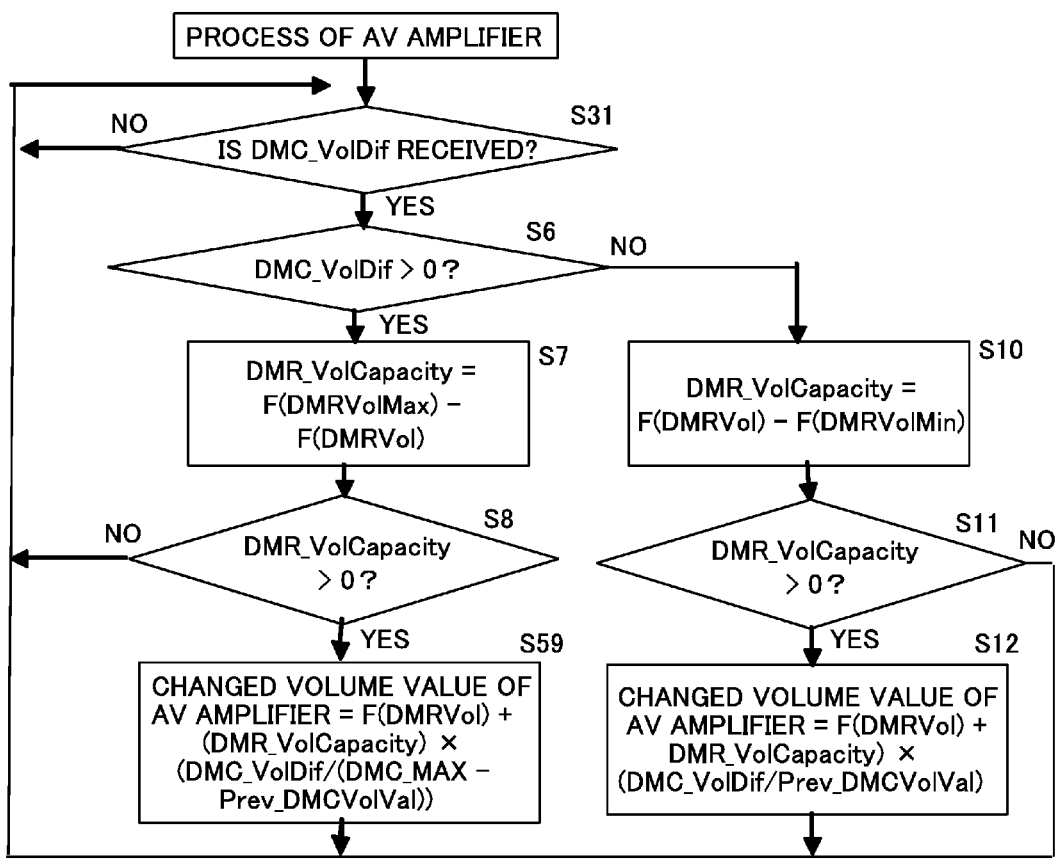
FIG. 7B is a flowchart illustrating a modified example of FIG. 7.

As shown in FIG. 8, when the controller-side volume setting value is changed (YES in S41), the controller 3B calculates DMC_VolDif=(Current_DMCvolVal−Prev_DMCVolVal) (S42), and transmits DMC_VolDif to the AV amplifier 11 (S43). As shown in FIG. 7, when receiving DMC_VolDif (YES in S31), the control section 12 of the AV amplifier 11 goes to S6. The process after S6 is the same as that in FIG. 5. As shown in FIG. 7B, instead of S9 in FIG. 7, S59 may be executed.

In the above embodiments, the decrease value of the volume value may be calculated by multiplying the third difference value by a ratio of the first difference value to (the maximum value of the controller-side volume setting value−the minimum value of the controller-side volume setting value). That is to say, the decrease value of the volume value=DMR_VolCapacity×(DMC_VolDif/100). Further, only when the controller-side volume setting value is increased, the volume value of the AV amplifier is increased, and when the controller-side volume setting value is decreased, the volume value of the AV amplifier does not have to be decreased. Further, only when the controller-side volume setting value is decreased, the volume value of the AV amplifier is decreased, and when the controller-side volume setting value is increased, the volume value of the AV amplifier does not have to be increased.

Still another preferred embodiment of the present invention is described below. In this example, when the controller-side volume setting value is changed into the maximum value (for example, 100), the volume value of the AV amplifier is changed into the maximum volume value F(DMRVolMax). In the formula in S9 in FIG. 5, even when the controller-side volume setting value is changed into the maximum value (for example, 100), the volume value of the AV amplifier 11 does not occasionally reach the maximum volume value F(DMRVolMax), thereby bringing a discomfort feeling to the user. For this reason, in this example, when the controller-side volume setting value is changed into the maximum value (for example, 100), the volume value of the AV amplifier 11 is always changed into the maximum volume value F(DMRVolMax) regardless of the formula in S9 in FIG. 5. Further, the maximum volume value F(DMRVolMax) can be changed by the user's operation using a WEB browser. As to the WEB browser, CGI is operated in the AV amplifier 11.

Figure 9:
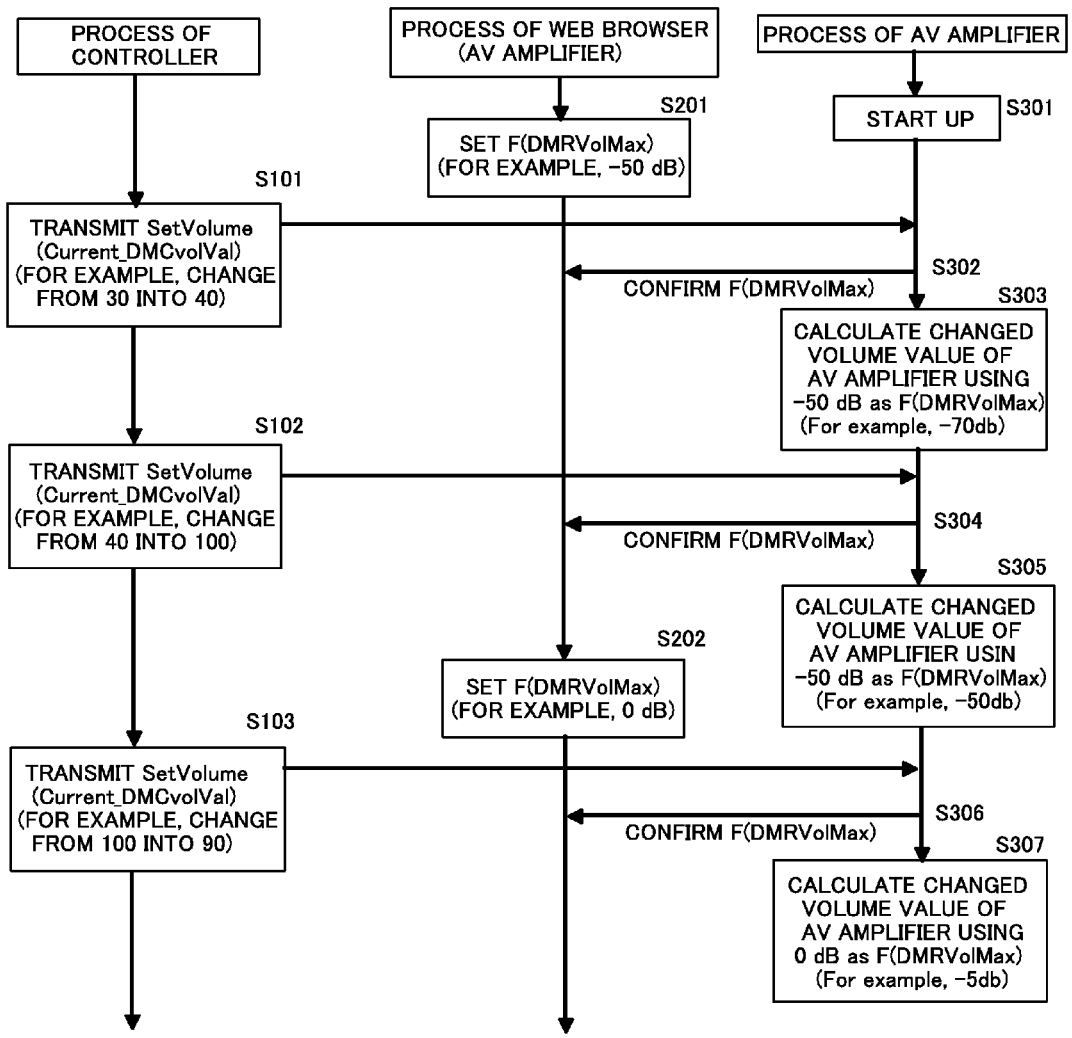
FIG. 9 is a sequence diagram describing a problem of another embodiment.

FIG. 9 is a sequence chart describing a new problem in this example. At first, the maximum volume value F(DMRVolMax) is set to, for example, −50 dB according to the user's operation on the WEB browser (S201). When the controller-side volume setting value is changed by the user's operation, the controller 3B transmits SetVolume(Current_DMCvolVal) (S110). For example, when the controller-side volume setting value is changed from 30 into 40, 40 is posted.

When receiving SetVolume(Current_DMCvolVal), the AV amplifier 11 acquires the maximum volume value F(DMRVolMax) from the WEB browser (S302). Here, −50 dB is acquired. The AV amplifier 11 calculates the changed volume value using −50 dB as F(DMRVolMax) based on S4 to S9 in FIG. 5, so as to control the volume (S303). Since the maximum volume value is −50 dB, for example, the volume value is changed into, for example, −70 dB.

Similarly, when the controller-side volume setting value is changed from 40 into 100 by the user's operation, the controller 3B transmits SetVolume(Current_DMCvolVal) representing that the controller-side volume setting value is changed into 100 (S102). When receiving SetVolume(Current_DMCvolVal), the AV amplifier 11 acquires the maximum volume value F(DMRVolMax) from the WEB browser (S304). At this time, F(DMRVolMax) is not changed and −50 dB is acquired. The AV amplifier 11 calculates the changed volume value using −50 dB as F(DMRVolMax), and controls the volume (S305). Sine the controller-side volume setting value is changed into 100 as the maximum value, the volume value is changed into −50 dB as F(DMRVolMax).

Thereafter, the maximum volume value F(DMRVolMax) is set to, for example, 0 dB according to the user's operation on the WEB browser (S202). When the controller-side volume setting value is changed from 100 into 90 by the user's operation, the controller 3B transmits SetVolume(Current_DMCvolVal) representing that the controller-side volume setting value is changed into 90 (S103).

When receiving SetVolume(Current_DMCvolVal), the AV amplifier 11 acquires the maximum volume value F(DMRVolMax) from the WEB browser (S306). Here, 0 dB is acquired. The AV amplifier 11 calculates the changed volume value using 0 dB as F(DMRVolMax) and controls the volume (S307). As a result, since the maximum value of the volume value is changed into 0 dB, the volume value is changed into −5 dB, for example. After F(DMRVolMax) is changed so as to be large, the changed volume value becomes large despite the decrease in the controller-side volume setting value, thereby bringing a discomfort feeling to the user. In some cases, this causes the damages of the amplifier and the speaker.

In order to solve this problem, in this example, when the calculated changed volume value becomes large despite the decrease in the controller-side volume setting value after F(DMRVolMax) is changed so as to be large, the volume value of the AV amplifier 11 is prevented from increasing (prevented from being changed). More concretely, the processes in FIGS. 10 and 11 are executed.

Figure 10:
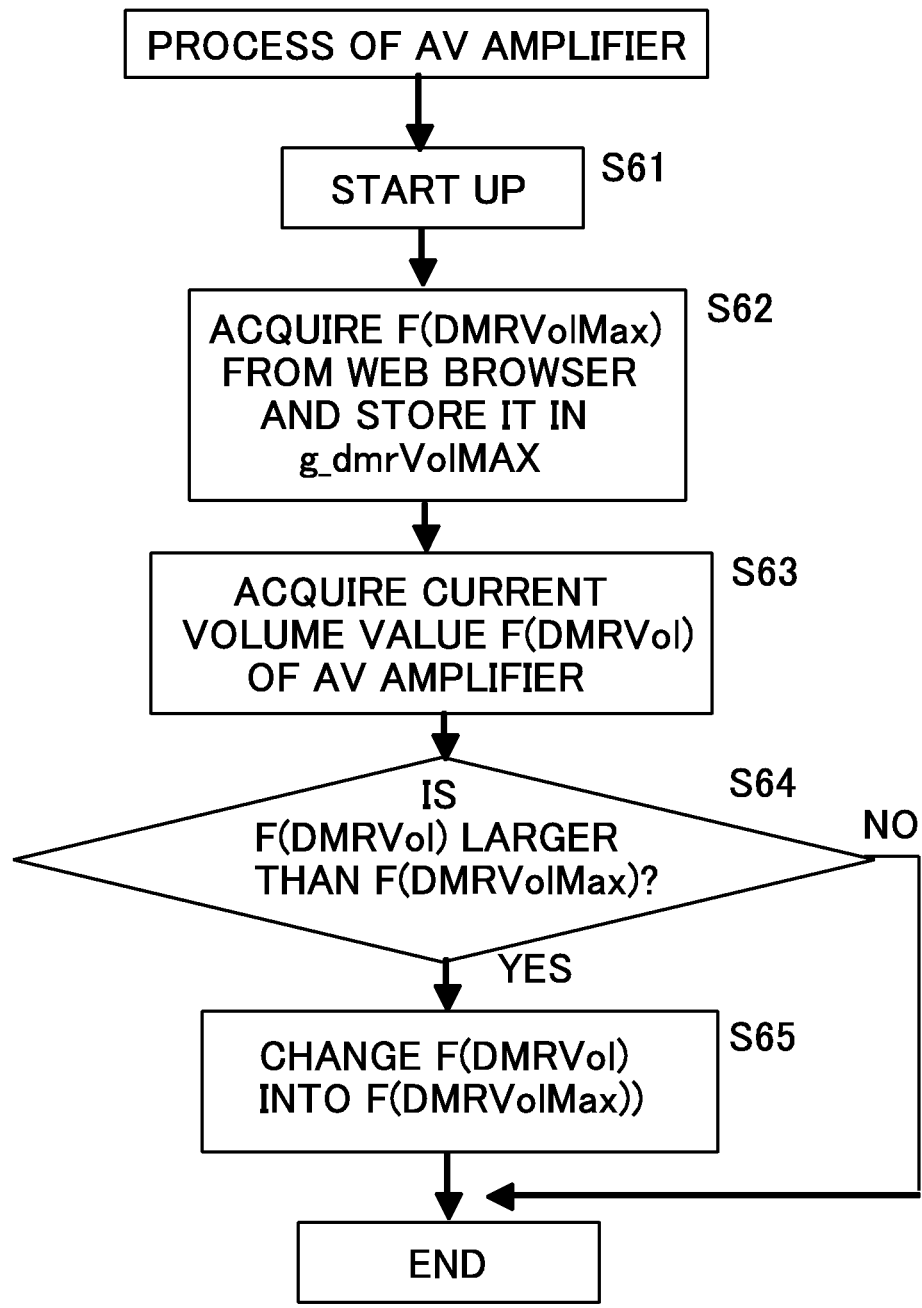
FIG. 10 is a flowchart illustrating a process of the control section of the AV amplifier.

FIG. 10 illustrates a process for starting up the AV amplifier 11. "Start up" means that a function as a network AV client in the AV amplifier 11 starts up. When the AV amplifier 11 starts up (S61), the control section 12 acquires the maximum volume value F(DMRVolMax) from the WEB browser, and stores it in a variable g_dmrVolMAX in the memory (S62). The control section 12 acquires the current volume value F(DMRVol) of the AV amplifier 11 (S63), and determines whether or not F(DMRVol) is larger than F(DMRVolMax) (S64). When it is larger (YES in S64), the control section 12 changes F(DMRVol) into F(DMRVolMax) (S65), and when it is not larger (NO in S64), the control section 12 ends the process. As a result, a defect such that the current volume value F(DMRVol) of the AV amplifier 11 is larger than F(DMRVolMax) can be prevented.

Figure 11:
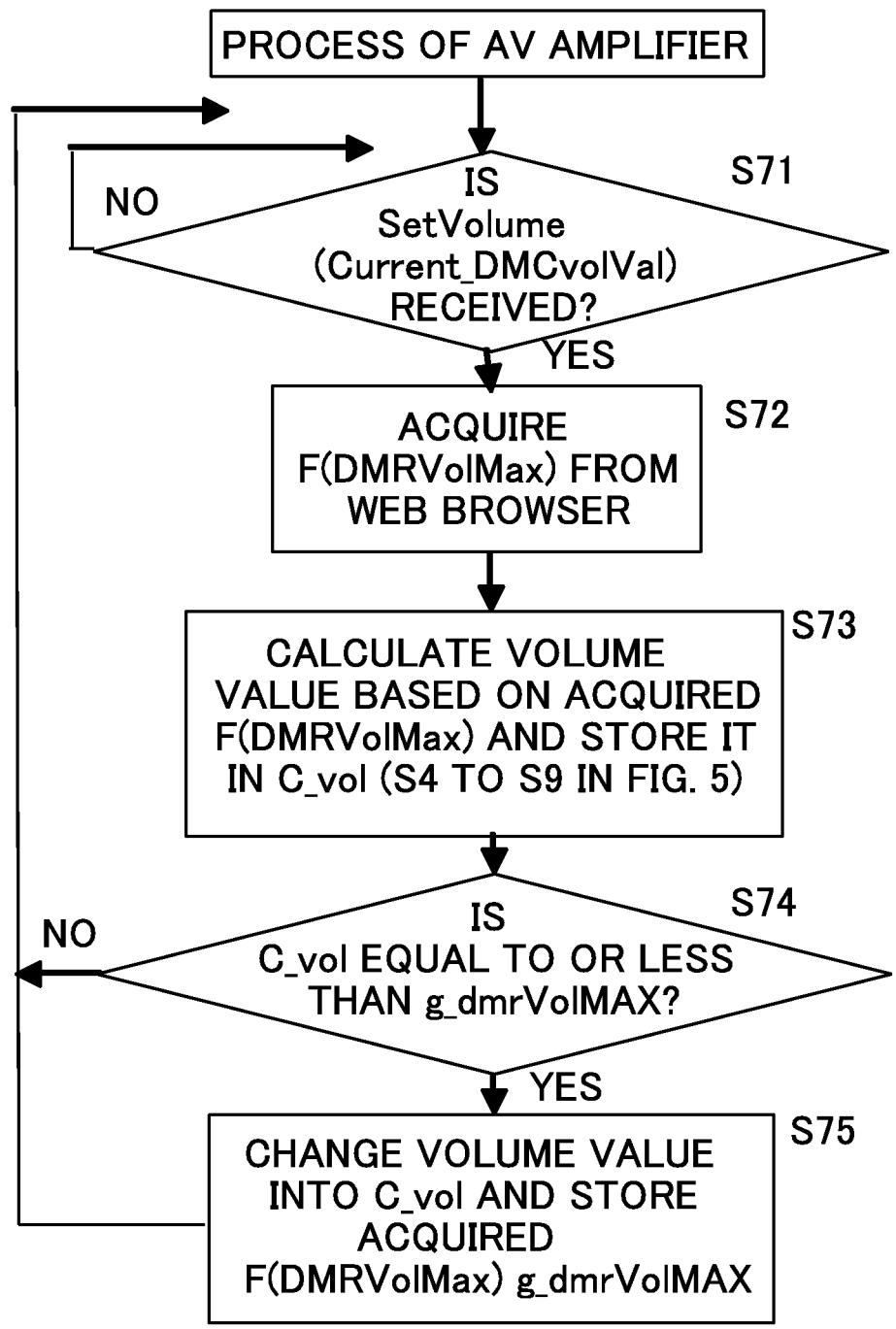
FIG. 11 is a flowchart illustrating a process of the control section of the AV amplifier.

FIG. 11 illustrates a process for receiving SetVolume(Current_DMCvolVal) is received from the controller 3B. When receiving SetVolume(Current_DMCvolVal) (YES in S71), the control section 12 acquires the maximum volume value F(DMRVolMax) from the WEB browser (S72). The control section 12 calculates the changed volume value based on S4 to S9 in FIG. 5 using the acquired F(DMRVolMax), and stores it in a variable C_vol in the memory (S73). The control section 12 determines whether or not C_vol is equal to or less than g_dmrVolMAX (S74). That is to say, the determination is made whether or not the changed volume value calculated by using the newly acquired F(DMRVolMax) is equal to or less than the last maximum volume value F(DMRVolMax).

When C_vol is larger than g_dmrVolMAX (NO in S74), the control section 12 does not change the volume value of the AV amplifier 11 into the volume value calculated in S73 and returns to S71. For example, in S202, S103, S306 and S307 in FIG. 9, since C_vol is −5 dB and g_dmrVolMAX is −50 dB, the volume value of the AV amplifier 11 is not changed into −5 dB. Similarly, thereafter, even when the controller-side volume setting value is increased so as to be changed from 90 into 95, in a state that C_vol is larger than g_dmrVolMAX, the control section 12 does not change the volume value of the AV amplifier 11 into the volume value calculated in S73. That is to say, even when the controller-side volume setting value is changed, the volume value of the AV amplifier 11 is made not to be changed until C_vol is once equal to or less than g_dmrVolMAX.

On the other hand, when C_vol is equal to or less than g_dmrVolMAX (YES in S74), the control section 12 changes the volume value of the AV amplifier 11 into the volume value calculated in S73, and stores the maximum volume value F(DMRVolMax) newly acquired in S72 in g_dmrVolMAX (updates g_dmrVolMAX) (S75). For example, when g_dmrVolMAX is −50 dB and thus C_vol is equal to or less than −50 dB, the volume value of the AV amplifier 11 is changed into C_vol. 0 dB as the newly acquired maximum volume value F(DMRVolMax) is stored in g_dmrVolMAX. Therefore, in the process thereafter, the changed volume value calculated in S73 is compared with 0 dB as g_dmrVolMAX, and the determination is made in S74 as YES, so that the volume value of the AV amplifier 11 can be increased.

In such a manner, the following problem can be solved. After F(DMRVolMax) is changed so as to be large, the changed volume value becomes large despite the decrease in the controller-side volume setting value, thereby bringing a discomfort feeling to the user.

The above describes the preferred embodiments of the present invention, but the present invention is not limited to them. For example, in S1 in FIG. 5 and S22 in FIG. 6, at the time of connection, the AV amplifier transmits the current volume value to the controller, and the controller may move the slide bar according to the current volume value of the AV amplifier. Thereafter, the controller transmits the controller-side volume setting value to the AV amplifier, and the AV amplifier sets the controller-side volume setting value as the initial value. In another manner, the AV amplifier may calculate the initial value of the controller-side volume setting value based on the current volume value of the AV amplifier. In this case, the process in S1 in FIG. 5 and S22 in FIG. 6 is not necessary. Further, when a range of the volume value of the AV amplifier is equal to a range of the controller-side volume setting value, the AV amplifier transmits the current volume value of the AV amplifier to the controller, and this volume value can be set directly as the controller-side volume setting value. The volume control apparatus may be provided in a form of a computer program that is executed by a computer or a recording medium in which the computer program is recorded.

What is claimed is:

1. A volume control apparatus that is connectable to a controller and controls a volume value of a sound signal based on an instruction from the controller, comprising:
   a receiving section for, when a controller-side volume setting value settable in the controller is changed by a user's operation, receiving the changed controller-side volume setting value from the controller;
   a first difference value calculating section for calculating DMC_VolDif=Current_DMCvolVal−Prev_DMCVolVal;
   a second difference value calculating section for calculating DMR_VolCapacity=F(DMRVolMax)−F(DMRVol); and
   an increase value calculating section for calculating an increase value of the volume value as DMR_VolCapacity×(DMC_VolDif/100),
   wherein
   DMC_VolDif is a first difference value,
   Current_DMCvolVal is the changed controller-side volume setting value,
   Prev_DMCVolVal is the controller-side volume setting value before change,
   DMR_VolCapacity is a second difference value,
   F(DMRVolMax) is a maximum volume value controllable by the controller, and
   F(DMRVol) is a current volume value.

2. The volume control apparatus according to claim 1, wherein when the controller-side volume setting value is changed into the maximum value, the volume value is increased to the maximum volume value controllable by the controller.

3. The volume control apparatus according to claim 1, wherein
   the maximum volume value controllable by the controller can be changed by a user's operation,
   after the maximum volume value controllable by the controller is changed according to the user's operation, when the controller-side volume setting value is changed, the volume value is not changed until the volume value calculated based on the changed maximum volume value controllable by the controller is equal to or less than the maximum volume value controllable by the controller before change.

4. A volume control apparatus that is connectable to a controller and controls a volume value of a sound signal based on an instruction from the controller, comprising:
   a receiving section for, when a controller-side volume setting value settable in the controller is changed by a user's operation, receiving the changed controller-side volume setting value from the controller;
   a first difference value calculating section for calculating DMC_VolDif=Current_DMCvolVal−Prev_DMCVolVal;
   a third difference value calculating section for calculating DMR_VolCapacity=F(DMRVol)−F(DMRVolMin); and
   a decrease value calculating section for calculating a decrease value of the volume value as DMR_VolCapacity×(DMC_VolDif/Prev_DMCVolVal),
   wherein
   DMC_VolDif is a first difference value,
   Current_DMCvolVal is the changed controller-side volume setting value, Prev_DMCVolVal is the controller-side volume setting value before change, DMR_VolCapacity is a third difference value, F(DMRVol) is a current volume value, and F(DMRVolMin) is a minimum value of the controller-side volume setting value.

5. A volume control apparatus that is connectable to a controller and controls a volume value of a sound signal based on an instruction from the controller, comprising:
- a receiving section for, when a controller-side volume setting value settable in the controller is changed by a user's operation, receiving DMC_VolDif=Current_DMCvolVal−Prev_DMCVolVal;
- a second difference value calculating section for calculating DMR_VolCapacity=F(DMRVolMax)−F(DMRVol); and
- an increase value calculating section for calculating an increase value of the volume value as DMR_VolCapacity×(DMC_VolDif/100), wherein DMC_VolDif is a first difference value, Current_DMCvolVal is the changed controller-side volume setting value, Prev_DMCVolVal is the controller-side volume setting value before change, DMR_VolCapacity is a second difference value, F(DMRVolMax) is a maximum volume value controllable by the controller, and F(DMRVol) is a current volume value.

6. A volume control apparatus that is connectable to a controller and controls a volume value of a sound signal based on an instruction from the controller, comprising:
- a receiving section for, when a controller-side volume setting value settable in the controller is changed by a user's operation, receiving DMC_VolDif=Current_DMCvolVal−Prev_DMCVolVal;
- a third difference value calculating section for calculating DMR_VolCapacity=F(DMRVol)−F(DMRVolMin); and
- a decrease value calculating section for calculating a decrease value of the volume value as DMR_VolCapacity×(DMC_VolDif/Prev_DMCVolVal), wherein DMC_VolDif is a first difference value, Current_DMCvolVal is the changed controller-side volume setting value, Prev_DMCVolVal is the controller-side volume setting value before change, DMR_VolCapacity is a third difference value, F(DMRVol) is a current volume value, and F(DMRVolMin) is a minimum value of the controller-side volume setting value.

* * * * *